United States Patent
Chen

(10) Patent No.: US 8,674,441 B2
(45) Date of Patent: Mar. 18, 2014

(54) HIGH VOLTAGE METAL-OXIDE-SEMICONDUCTOR TRANSISTOR DEVICE

(75) Inventor: Chin-Fu Chen, Taoyuan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/543,895

(22) Filed: Jul. 9, 2012

(65) Prior Publication Data

US 2014/0008725 A1 Jan. 9, 2014

(51) Int. Cl.
*H01L 29/66* (2006.01)

(52) U.S. Cl.
USPC .................. 257/343; 257/E29.256

(58) Field of Classification Search
None
See application file for complete search history.

(56) References Cited

U.S. PATENT DOCUMENTS

| | | | |
|---|---|---|---|
| 4,344,081 A | 8/1982 | Pao | |
| 4,396,999 A | 8/1983 | Malaviya | |
| 4,893,160 A | 1/1990 | Blanchard | |
| 4,918,333 A | 4/1990 | Anderson | |
| 4,958,089 A | 9/1990 | Fitzpatrick | |
| 5,040,045 A | 8/1991 | McArthur | |
| 5,268,589 A | 12/1993 | Dathe | |
| 5,296,393 A | 3/1994 | Smayling | |
| 5,326,711 A | 7/1994 | Malhi | |
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,811,850 A | 9/1998 | Smayling | |
| 5,950,090 A | 9/1999 | Chen | |
| 5,998,301 A | 12/1999 | Pham | |
| 6,066,884 A | 5/2000 | Krutsick | |
| 6,144,538 A | 11/2000 | Chao | |
| 6,165,846 A | 12/2000 | Carns | |
| 6,245,689 B1 | 6/2001 | Hao | |
| 6,277,675 B1 | 8/2001 | Tung | |
| 6,277,757 B1 | 8/2001 | Lin | |
| 6,297,108 B1 | 10/2001 | Chu | |
| 6,306,700 B1 | 10/2001 | Yang | |
| 6,326,283 B1 | 12/2001 | Liang | |
| 6,353,247 B1 | 3/2002 | Pan | |
| 6,388,292 B1 | 5/2002 | Lin | |
| 6,400,003 B1 | 6/2002 | Huang | |
| 6,424,005 B1 | 7/2002 | Tsai | |
| 6,514,830 B1 | 2/2003 | Fang | |
| 6,521,538 B2 | 2/2003 | Soga | |
| 6,614,089 B2 | 9/2003 | Nakamura | |
| 6,713,794 B2 | 3/2004 | Suzuki | |
| 6,762,098 B2 | 7/2004 | Hshieh | |
| 6,764,890 B1 | 7/2004 | Xu | |
| 6,784,060 B2 | 8/2004 | Ryoo | |
| 6,784,490 B1 | 8/2004 | Inoue | |
| 6,819,184 B2 | 11/2004 | Pengelly | |
| 6,822,296 B2 | 11/2004 | Wang | |
| 6,825,531 B1 | 11/2004 | Mallikarjunaswamy | |
| 6,846,729 B2 | 1/2005 | Andoh | |
| 6,855,581 B2 | 2/2005 | Roh | |

(Continued)

*Primary Examiner* — Michael Lebentritt
*Assistant Examiner* — Kevin Quinto
(74) *Attorney, Agent, or Firm* — Winston Hsu; Scott Margo

(57) ABSTRACT

A high voltage metal-oxide-semiconductor transistor device includes a substrate, a gate formed on the substrate, a source region and a drain region formed in the substrate at respective sides of the gate, and a first isolation structure formed under the gate. The first isolation structure is overlapped by the entire gate.

16 Claims, 5 Drawing Sheets

(56) References Cited

U.S. PATENT DOCUMENTS

| | | | |
|---|---|---|---|
| 6,869,848 B2 | 3/2005 | Kwak | |
| 6,894,349 B2 | 5/2005 | Beasom | |
| 6,958,515 B2 | 10/2005 | Hower | |
| 7,015,116 B1 | 3/2006 | Lo | |
| 7,023,050 B2 | 4/2006 | Salama | |
| 7,037,788 B2 | 5/2006 | Ito | |
| 7,075,575 B2 | 7/2006 | Hynecek | |
| 7,078,286 B1 | 7/2006 | Mehta | |
| 7,091,079 B2 | 8/2006 | Chen | |
| 7,148,540 B2 | 12/2006 | Shibib | |
| 7,214,591 B2 | 5/2007 | Hsu | |
| 7,309,636 B2 | 12/2007 | Chen | |
| 7,323,740 B2 | 1/2008 | Park | |
| 7,358,567 B2 | 4/2008 | Hsu | |
| 7,427,552 B2 | 9/2008 | Jin | |
| 2003/0022460 A1 | 1/2003 | Park | |
| 2003/0119229 A1* | 6/2003 | Roh et al. | 438/149 |
| 2004/0018698 A1 | 1/2004 | Schmidt | |
| 2004/0070050 A1 | 4/2004 | Chi | |
| 2004/0192009 A1* | 9/2004 | Belyansky et al. | 438/424 |
| 2004/0251513 A1* | 12/2004 | Su et al. | 257/510 |
| 2005/0227448 A1 | 10/2005 | Chen | |
| 2005/0258496 A1 | 11/2005 | Tsuchiko | |
| 2005/0275037 A1* | 12/2005 | Chung | 257/374 |
| 2006/0035437 A1 | 2/2006 | Mitsuhira | |
| 2006/0261407 A1 | 11/2006 | Blanchard | |
| 2006/0270134 A1 | 11/2006 | Lee | |
| 2006/0270171 A1 | 11/2006 | Chen | |
| 2007/0041227 A1 | 2/2007 | Hall | |
| 2007/0054464 A1 | 3/2007 | Zhang | |
| 2007/0082440 A1 | 4/2007 | Shiratake | |
| 2007/0132033 A1 | 6/2007 | Wu | |
| 2007/0273001 A1 | 11/2007 | Chen | |
| 2008/0160697 A1 | 7/2008 | Kao | |
| 2008/0160706 A1 | 7/2008 | Jung | |
| 2008/0185629 A1 | 8/2008 | Nakano | |
| 2008/0296655 A1 | 12/2008 | Lin | |
| 2008/0308868 A1 | 12/2008 | Wu | |
| 2009/0065863 A1* | 3/2009 | Park | 257/343 |
| 2009/0108348 A1 | 4/2009 | Yang | |
| 2009/0111252 A1 | 4/2009 | Huang | |
| 2009/0159966 A1 | 6/2009 | Huang | |
| 2009/0278208 A1 | 11/2009 | Chang | |
| 2009/0294865 A1 | 12/2009 | Tang | |
| 2010/0006937 A1 | 1/2010 | Lee | |
| 2010/0032758 A1 | 2/2010 | Wang | |
| 2010/0096702 A1 | 4/2010 | Chen | |
| 2010/0148250 A1 | 6/2010 | Lin | |
| 2010/0213517 A1 | 8/2010 | Sonsky | |
| 2011/0001196 A1 | 1/2011 | Huang | |
| 2011/0057263 A1 | 3/2011 | Tang | |
| 2012/0025307 A1* | 2/2012 | Komatsu et al. | 257/335 |

* cited by examiner

US 8,674,441 B2

HIGH VOLTAGE METAL-OXIDE-SEMICONDUCTOR TRANSISTOR DEVICE

BACKGROUND OF THE INVENTION

1. Field of the Invention

The invention relates to a high voltage metal-oxide-semiconductor (herein after abbreviated as HV MOS) device, and more particularly, to a high voltage lateral double-diffused metal-oxide-semiconductor (HV-LDMOS) device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dope concentration and large area. The drift region is used to alleviate the high voltage between the drain and the source, therefore the LDMOS transistor device can have higher breakdown voltage.

Please refer to FIG. 1, which is a cross-sectional view of a conventional HV-LDMOS transistor device. As shown in FIG. 1, the conventional HV-LDMOS transistor device 10 having a p-type well 20, a source 14 and a p-type heavily doped region 22 formed in the p-type well 20, a gate 16 and a drain 18 is formed on a semiconductor substrate 12. The drain 18 is an n-type heavily doped region formed in an n-type well 30, which is the drift region as mentioned above. The dope concentration and length of the drift region affects the breakdown voltage and the ON-resistance ($R_{ON}$) of the HV-LDMOS transistor device 10. The gate 16 of the HV-LDMOS transistor device 10 is positioned on a gate dielectric layer 40 and extended to cover a portion of a field oxide layer 42.

It is well-known that characteristics of low $R_{ON}$ and high breakdown voltage are always required to the HV MOS transistor device. However, breakdown voltage and $R_{ON}$ are conflicting parameters with a trade-off relationship. Therefore, a HV LDMOS transistor device that is able to realize high breakdown voltage and low $R_{ON}$ is still in need.

SUMMARY OF THE INVENTION

According to the claimed invention, a HV MOS transistor device is provided. The HV MOS transistor device includes a substrate, a gate formed on the substrate, a source region and a drain region formed in the substrate at respective sides of the gate, and a first isolation structure formed under the gate. The first isolation structure is overlapped by the entire gate.

According to the claimed invention, a HV MOS transistor device is further provided. The HV MOS transistor device includes a substrate, a gate positioned on the substrate and extending along a first direction, a plurality of drift regions formed in the substrate, and a plurality of first isolation structures formed in the substrate. The drift regions are arranged along the first direction. Each of the first isolation structures extends along a second direction, and the second direction is perpendicular to the first direction. The gate covers a portion of each drift region and a portion of each first isolation structure, and the drift regions and the first isolation structures under the gate are alternately arranged along the first direction.

According to the HV MOS transistor device provided by the present invention, the first isolation structure is provided to be overlapped by the entire gate, therefore the breakdown voltage is improved without increasing $R_{ON}$.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
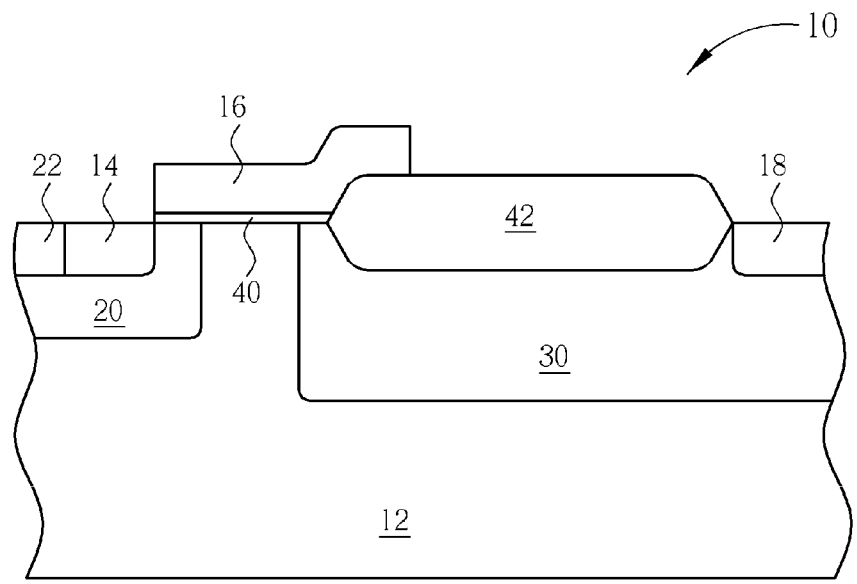
FIG. 1 is a cross-sectional view of a conventional HV-LDMOS transistor device.
Figure 2:
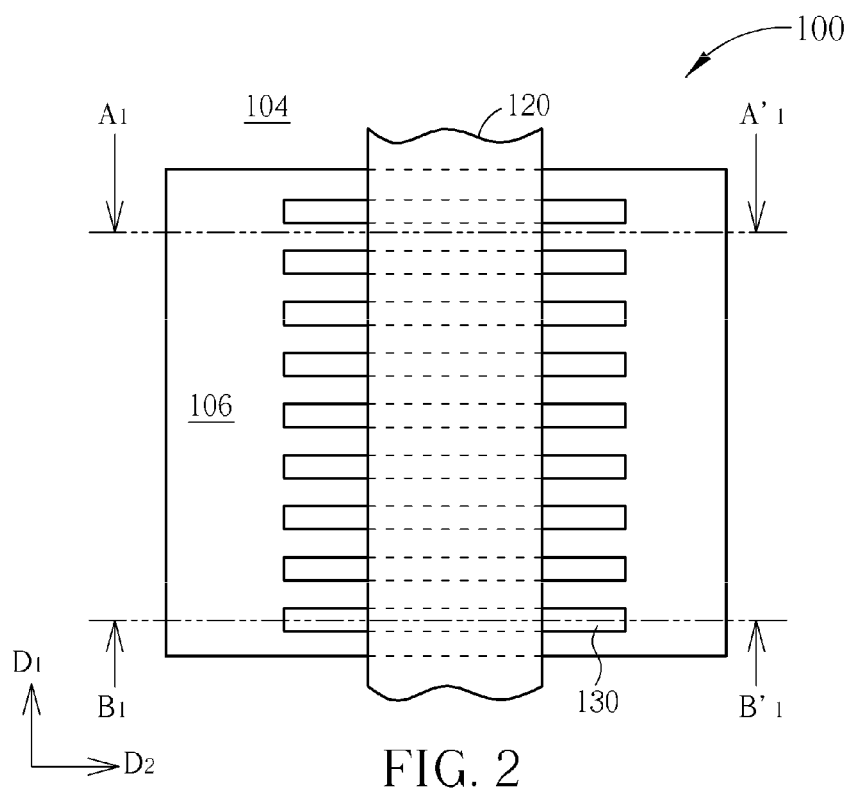
FIG. 2 is a schematic drawing of a portion of a layout pattern of a HV MOS transistor device provided by a first preferred embodiment of the present invention.
Figure 3:
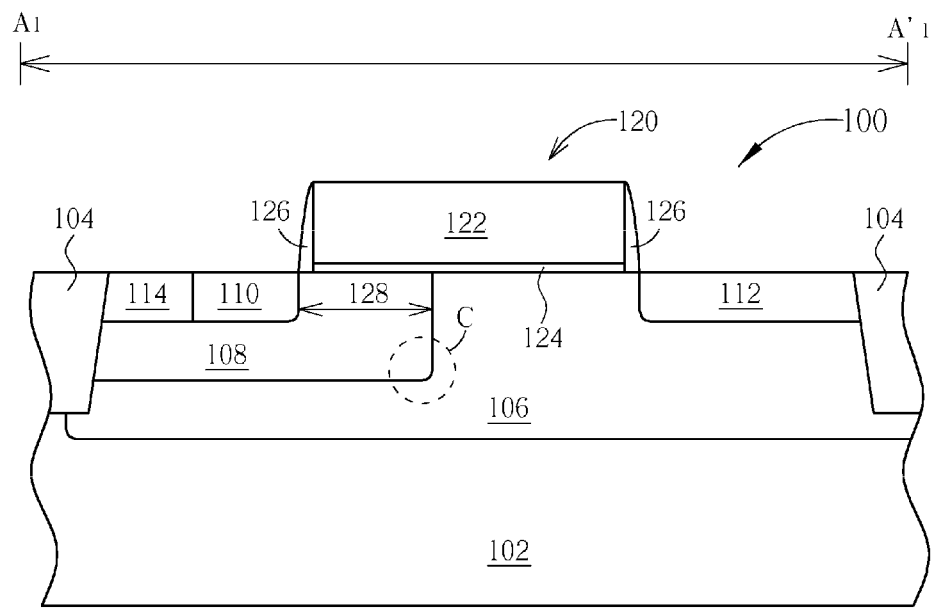
FIG. 3 is a cross-sectional view of the HV MOS transistor device taken along line $A_1$-$A_1'$ of FIG. 2.
Figure 4:
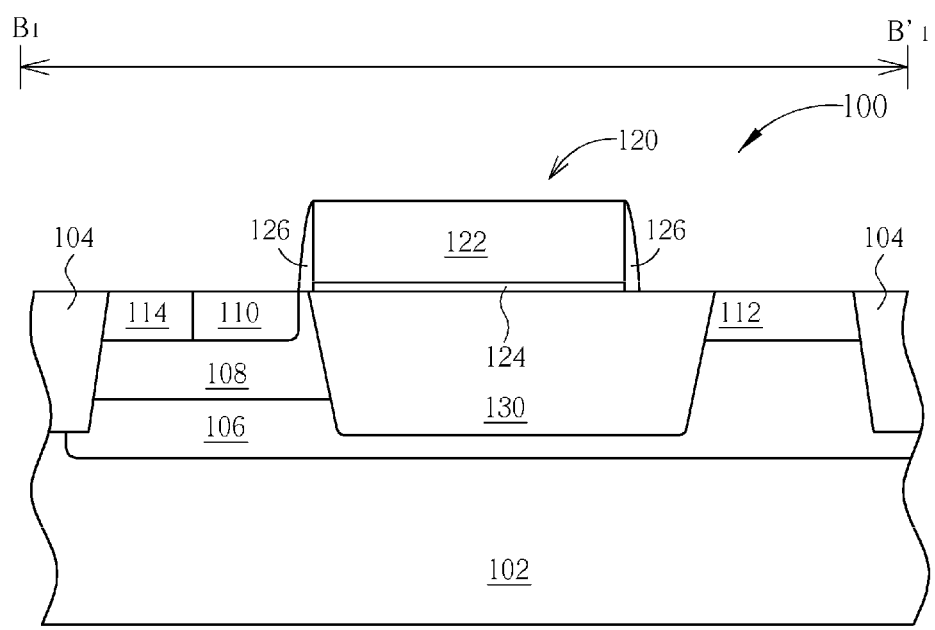
FIG. 4 is a cross-sectional view of the HV MOS transistor device taken along line $B_1$-$B_1'$ of FIG. 2

Please refer to FIGS. 2-4, FIG. 2 is a schematic drawing of a portion of a layout pattern of a HV MOS transistor device provided by a first preferred embodiment of the present invention, and FIGS. 3 and 4 are cross-sectional views of the HV MOS transistor device taken along line $A_1$-$A_1'$ and line $B_1$-$B_1$,' of FIG. 2, respectively. As shown in FIGS. 2-4, a HV MOS transistor device 100 provided by the preferred embodiment is positioned on a substrate 102, such as a silicon substrate. The substrate 102 includes a first conductivity type. In the preferred embodiment, the first conductivity type is p-type. The HV MOS transistor device 100 further includes a gate 120 positioned on the substrate 102 and a drift region 106 formed in the substrate 100. The drift region 106 includes a second conductivity type. The second conductivity type and the first conductivity type are complementary to each other. Accordingly, the second conductivity type is n-type and the drift region 106 is an n-drift region 106 in the preferred embodiment. A body region 108 is formed in the drift region 106. The body region 108 includes the first conductivity type and thus is a p-body region 108. A source region 110 and a drain region 112 are formed in the substrate 102 at respective sides of the gate 120. Both of the source region 110 and the drain region 112 include the second conductivity type. Accordingly, the preferred embodiment provides an n-source region 110 and an n-drain region 112. As shown in FIGS. 3 and 4, the source region 110 is formed in the p-body region 108 while the drain region 112 is formed in the n-drift region 106. Furthermore, a p-doped region 114 is formed in the p-body region 108. The p-doped region 114 is electrically connected to the n-source region 110. It is noteworthy that the n-source region 110, the n-drain region 112, the p-body region 108, and the p-doped region 114 are all omitted from FIG. 2 for clarifying spatial relationships between certain specific elements of the HV MOS transistor device 100. However, those skilled in the art would easily realize the locations where those omitted regions are formed according to FIGS. 3-4 and thus those details are omitted herein in the interest of brevity.

In order to clearly describe the structure of the preferred embodiment, FIGS. 2-4 should be referred together. The gate 120 of the HV MOS transistor device 100 provided by the preferred embodiment includes a gate conductive layer 122, a gate dielectric layer 124, and a spacer formed on sidewalls of the gate conductive layer 122. As shown in FIG. 2, the gate 120 formed on the substrate 102 extends along a first direction $D_1$. In addition, a plurality of shallow trench isolations (STIs) 104 is formed in the substrate 102 for electrically isolating the HV MOS transistor device 100 from other devices. It is noteworthy that the HV MOS transistor device 100 provided by the preferred embodiment further includes a plurality of isolation structures 130, such as a plurality of STIs. As shown in FIG. 4, a depth of the isolation structure 130 can be equal to a depth of the STI 104, but not limited to this. Each of the isolation structures 130 extends a long a second direction $D_2$, and thus the isolation structures 130 are parallel with each other. Additionally, the second direction $D_2$ and the first direction $D_1$ are crossed, preferably are perpendicular to each other as shown in FIG. 2. More important, the isolation structures 130 are formed to interrupt the n-drift region 106. Consequently, it looks like there are n-drift regions 106 and the isolation structures 130 alternately arranged along the first direction $D_1$ under the gate 120 while the n-drift regions 106 are electrically connected to each other and thus to form a continuous region. In other words, the gate 120 covers a portion of each drift region 106 and a portion of each first isolation structure 130, and thus the drift regions 106 and the first isolation structures 130 under the gate 120 are alternately arranged along the first direction $D_1$. As shown in FIG. 2, a width of the isolation structures 130 is equal to a width of the n-drift regions 106 under the gate 120 according to the preferred embodiment, but not limited to this. Furthermore, the isolation structures 130 and the STI 104 can be simultaneously formed, but not limited to this.

As shown in FIGS. 2-4, the n-drift regions 106 (and a portion of the p-body region 108 formed therein) and the isolation structures 130 are alternately arranged under the gate 120. As shown in FIG. 4, in the case that the isolation structure 130 is formed under the gate 120, the isolation structure 130 is overlapped by the entire the gate 120. In other words, the entire gate 120 is accommodated on the isolation structure 130. Consequently, the isolation structure 130 occupies where the channel region supposed to be formed. However, in the case that n-drift region 106 and the portion of the p-body region 108 are formed under the gate 120 as shown in FIG. 3, the channel region 128 is still obtained when proper voltage is applied. Thus it is ensured that current achieves the source region 110 from the drain region 112 through the n-drift region 106 and the channel region 128. Accordingly, the high voltage is step-downed and the acceptable lower voltage signal is obtained. More important, two sides of each n-drift region 106 are adjacent to and clamped by the isolation structures 130 along the second direction $D_2$ as shown in FIG. 2, thus electric field of the n-drift regions 106 is reduced and the breakdown voltage is improved. Furthermore, it is well-known to those skilled in the art that the corner of the p-body region 108 (as emphasized in Circle C in FIG. 3) includes the weakest p-n junction. Therefore the depth of the isolation structures 130 is preferably larger than a depth of the p-body region 108. Consequently, the corner C of the p-body region 108 is clamped by the isolation structures 130 and thus the electric field is reduced. As a result, breakdown that usually occurs at the corner C of the p-body region 108 of the conventional HV MOS transistor device is prevented.

Therefore, according to the HV MOS transistor device 100 provided by the first preferred embodiment, the breakdown voltage is increased without increasing $R_{ON}$ by the n-drift regions 106 and the isolation structures 130 alternately arranged under the gate 120.

Figure 5:
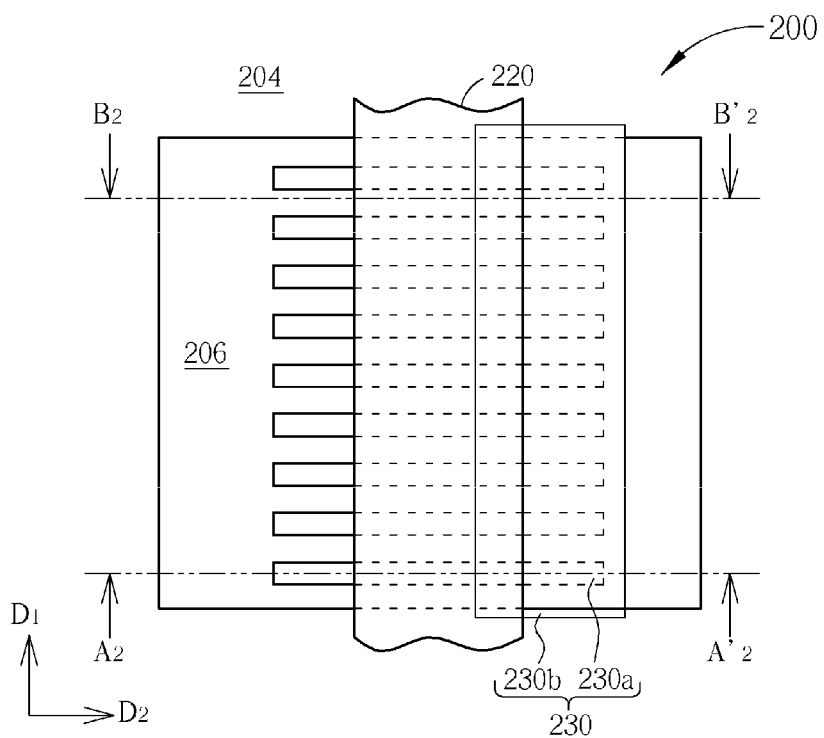
FIG. 5 is a schematic drawing of a portion of a layout pattern of a HV MOS transistor device provided by a second preferred embodiment of the present invention.
Figure 6:
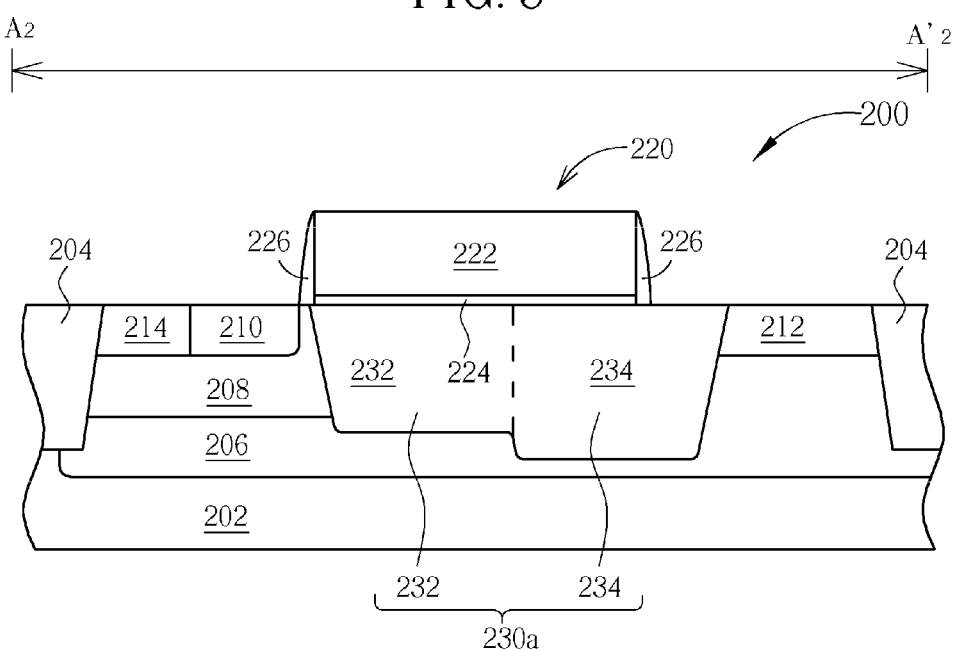
FIG. 6 is a cross-sectional view of the HV MOS transistor device taken along line $A_2$-$A_2'$ of FIG. 5.
Figure 7:
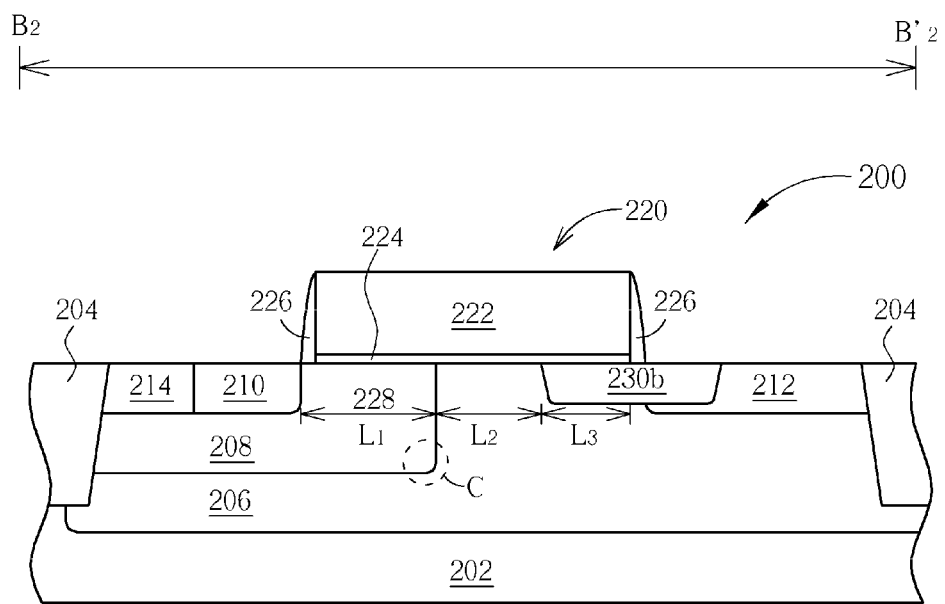
FIG. 7 is a cross-sectional view of the HV MOS transistor device taken along line $B_2$-$B_2'$ of FIG. 5.

Please refer to FIGS. 5-7, FIG. 5 is a schematic drawing of a portion of a layout pattern of a HV MOS transistor device provided by a second preferred embodiment of the present invention, and FIGS. 6 and 7 are cross-sectional views of the HV MOS transistor device taken along line $A_2$-$A_2$' and line $B_2$-$B_2$,' of FIG. 5, respectively. As shown in FIGS. 5-7, a HV MOS transistor device 200 provided by the preferred embodiment is positioned on a substrate 202. The substrate 202 includes a first conductivity type. In the preferred embodiment, the first conductivity type is p-type. The HV MOS transistor device 200 further includes a gate 220 positioned on the substrate 202 and a drift region 206 formed in the substrate 200. The drift region 206 includes a second conductivity type. The second conductivity type and the first conductivity type are complementary to each other. Accordingly, the second conductivity type is n-type and the drift region 206 is an n-drift region 206 in the preferred embodiment. A body region 208 is formed in the drift region 206. The body region 208 includes the first conductivity type and thus is a p-body region 208. A source region 210 and a drain region 212 are formed in the substrate 202 at respective sides of the gate 220. Both of the source region 210 and the drain region 212 include the second conductivity type. Accordingly, the preferred embodiment provides an n-source region 210 and an n-drain region 212. As shown in FIGS. 6 and 7, the source region 210 is formed in the p-body region 208 while the drain region 212 is formed in the n-drift region 206. Furthermore, a p-doped region 214 is formed in the p-body region 208. The p-doped region 214 is electrically connected to the n-source region 210. It is noteworthy that the n-source region 210, the n-drain region 212, the p-body region 208, and the p-doped region 214 are all omitted from FIG. 5 for clarifying spatial relationships between certain specific elements of the HV MOS transistor device 200. However, those skilled in the art would easily realize the locations where those omitted regions are formed according to FIGS. 6-7 and thus those details are also omitted herein in the interest of brevity.

In order to clearly describe the structure of the preferred embodiment, FIGS. 5-7 should be referred together. The gate 220 of the HV MOS transistor device 200 provided by the preferred embodiment includes a gate conductive layer 222, a gate dielectric layer 224, and a spacer 226 formed on sidewalls of the gate conductive layer 222. As shown in FIG. 5, the gate 220 formed on the substrate 202 extends along a first direction $D_1$. In addition, a plurality of STIs 204 is formed in the substrate 202 for electrically isolating the HV MOS transistor device 200 from other devices. It is noteworthy that the HV MOS transistor device 200 provided by the preferred embodiment further includes a plurality of isolation structures 230, such as a plurality of STIs. And the isolation structures 230 respectively include a first isolation structure 230a and a second isolation structure 230b. As shown in FIG. 5, each of the first isolation structures 230a extends along a second direction $D_2$ while the second direction $D_2$ and the first direction $D_1$ are crossed, preferably are perpendicular to each other as shown in FIG. 5. More important, the first isolation structures 230a are formed to interrupt the n-drift region 206. Consequently, it looks like there are n-drift regions 206 and the first isolation structures 230a alternately arranged along the first direction $D_1$ under the gate 220 while the n-drift regions 206 are electrically connected to each other and thus to form a continuous region. In other words, the gate 220 covers a portion of each drift region 206 and a portion of each first isolation structure 230, and the drift regions 206 and the first isolation structures 230 under the gate 220 are alternately arranged along the first direction $D_1$. As shown in FIG. 5, a width of the first isolation structures 230a is equal to a width of the n-drift regions 206 under the gate 220 according to the preferred embodiment, but not limited to this. The second isolation structure 230b of the isolation structure 230 are formed to extend along the first direction $D_1$ and positioned under the edge of the gate 220 at drain side. As shown in FIG. 5, the second isolation structure 230b overlaps with and physically contacts a portion of each first isolation structure 230a. Furthermore, the second isolation structures 230b are all physically connected to each other and thus to form a continuous structure. Therefore the second isolation structures 230b can be taken as one second isolation structure. Accordingly, the second isolation structures 230a and the first isolation structures 230a form a comb-shaped isolation structure. Specifically, the second isolation structures 230b serve as the base of the comb-shaped isolation structure, and the first isolation structures 230a serve as the teeth of the isolation structure.

Please refer to FIGS. 5 and 7. In the preferred embodiment, different suitable fabricating processes can be used to form the STI 204 and the isolation structures 230. For example, a shallow trench (not shown) for defining the position where the second isolation structure 230b supposed to be formed is first formed on the substrate 202. Subsequently, a patterned mask (not shown) for defining where the first isolation structures 230a and the STI 204 supposed to be formed is formed on the substrate 202. Then, an etching process is performed to etch the substrate 202 through the patterned mask and thus deep trenches (not shown) are formed in the substrate 202. The shallow trench and deep trenches are filled with an insulating material and followed by performing a planarization process. Accordingly, the first isolation structures 230a, the second isolation structure 230b and the STI 204 are simultaneously formed. As shown in FIG. 7, since the second isolation structure 230b overlaps with a portion of each first isolation structure 230a, those overlapped regions are etched deeper. Consequently, the first isolation structures 230a respectively includes a first portion 232 and a deeper second portion 234. As shown in FIG. 6, a depth of the first portion 232 is equal to a depth of the STI 204 while a depth of the second portion 234 is larger than the depth of the STI 204 according to the preferred embodiment. Additionally, a depth of the second isolation structure 230b is smaller than the depth of the first isolation structure 230a and of the STI 204, and preferably smaller than a depth of the drain region 212 as shown in FIG. 7. It should be well-known to those skilled in the art that the fabricating processes for forming the STI 204, the first isolation structures 230a and the second isolation structure 230b are not limited to this. According to modification to the preferred embodiment, the first isolation structures 230a can be a structure without depth deviation. In other words, each first isolation structure 230a itself includes one depth equal to the depth of the STI 204.

Please refer to FIG. 7. The gate conductive layer 222 overlaps a portion of the p-body region 208 and thus a channel region 228 is formed according to the preferred embodiment. The channel region 228 includes a length $L_1$. The gate 220 also overlaps and contacts a portion of the n-drift region 206 and the overlapped region includes a length $L_2$. Furthermore, the gate conductive layer 222 overlap a portion of the second isolation structure 230b and the overlapped region includes a length $L_3$. As shown in FIG. 7, the channel region 228 and the second isolation structure 230b are spaced apart from each other by the n-drift region 206. More important, neither of the length $L_1$, the length $L_2$, and the length $L_3$ is equal to 0 according to the preferred embodiment. Since the depth of the second isolation structure 230b is smaller than the STI 204, electric field crowding is reduced and thus the breakdown voltage is increased without increasing $R_{ON}$.

Please still refer to FIG. 5-7. The n-drift regions 206 (and a portion of the p-body region 208 formed therein) and the isolation structures 230 are alternately arranged under the gate 220. As shown in FIG. 6, in the case that the first isolation structure 230a of the isolation structure 230 is formed under the gate 220, the first isolation structure 230a is overlapped by the entire gate 220. In other words, the entire gate 220 is accommodated on the first isolation structure 230a. Consequently, the first isolation structure 230a occupies where the channel region supposed to be formed. However, in the case that the second isolation structure 230b of the isolation structure 230, the n-drift region 206 and the portion of the p-body region 208 are formed under the gate 220 as shown in FIG. 7, the channel region 228 is still obtained when proper voltage is applied. Thus it is ensured that current achieves the source region 210 from the drain region 212 through the n-drift region 206 and the channel region 228. Consequently, the high voltage is step-downed and the acceptable lower voltage signal is obtained. More important, two sides of each n-drift region 206 are adjacent to and clamped by the first isolation structures 230a along the second direction $D_2$ as shown in FIGS. 5 and 6, thus electric field of the n-drift regions 206 is reduced and the breakdown voltage is improved. Furthermore, it is well-known to those skilled in the art that the corner of the p-body region 208 (as emphasized in Circle C in FIG. 7) includes the weakest p-n junction. Therefore the depth of the first isolation structures 230a is preferably larger than a depth of the p-body region 208. Consequently, the corner C of the p-body region 208 is clamped by the first isolation structures 230a and thus the electric field is reduced. As a result, breakdown that usually occurs at the corner C of the p-body region 208 of the conventional HV MOS transistor device is prevented.

Therefore, according to the HV MOS transistor device 200 provided by the second preferred embodiment, electric field crowding effect is reduced by forming the second isolation structure 230b under the gate 220. Furthermore, the breakdown voltage is increased without increasing $R_{ON}$ by the n-drift regions 206 and the first isolation structures 230a alternately arranged under the gate 220.

Figure 8:
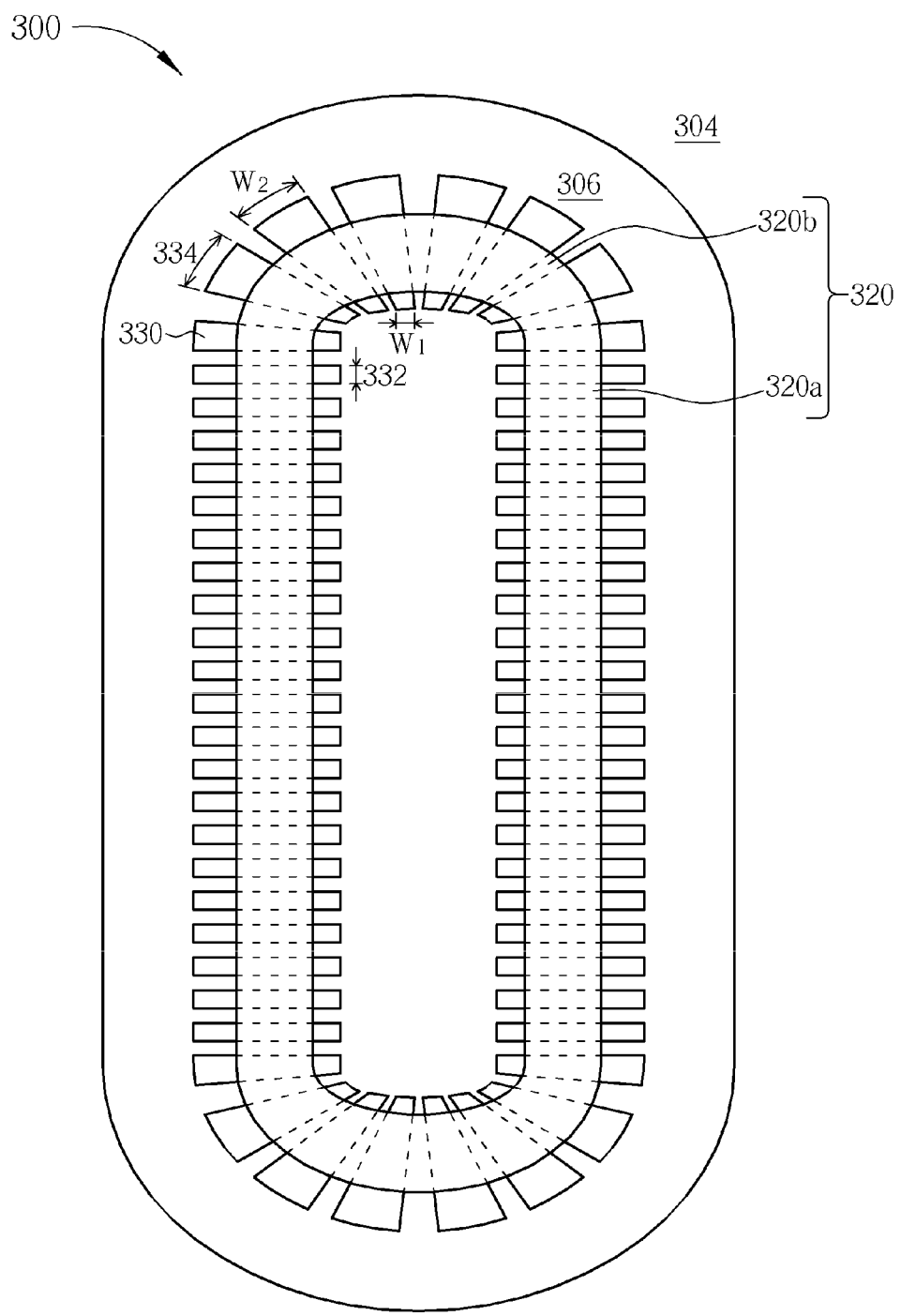
FIG. 8 is a schematic drawing of a portion of a layout pattern of a HV MOS transistor device provided by a third preferred embodiment of the present invention.

Please refer to FIG. 8, which is a schematic drawing of a portion of a layout pattern of a HV MOS transistor device provided by a third preferred embodiment of the present invention. It is noteworthy that for clarifying and emphasizing certain elements of the HV MOS transistor device provided by the third preferred embodiment, doped regions such as the source region, the drain region, and the body region are all omitted from FIG. 8. However, those skilled in the art would easily realize the locations where those doped regions are formed according to the aforementioned first and second preferred embodiments.

Please refer to FIG. 8. A HV MOS transistor device 300 provided by the preferred embodiment includes an n-drift region 306 formed in a substrate (not shown) and a gate 320 formed on the n-drift region 306. The gate 320 has a layout pattern of a racetrack shape. As shown in FIG. 8, the gate 320 includes a pair of liner gate portions 320a that parallel with each other and a pair of curved end gate portions 320b that respectively positioned at two ends of the liner gate portions 320a. However, the gate 320 of the preferred embodiment is not limited to this. For example, the gate 320 can include a rectangular and hollow layout pattern, or the gate 320 extends along an edge of a comb pattern and thus obtains a hollow comb-shaped layout pattern. It should be noted that the HV MOS transistor device 300 provided by the preferred embodiment can employ common source approach or common source approach. In the case that the HV MOS transistor device 300 employs the common source approach, the source region is formed in the n-drift region 306 in the center of the racetrack-shaped gate 320. In other words, the common source is enclosed by the gate 320. In the same concept, in the case that the HV MOS transistor device 300 employs the common drain approach, the drain region is formed in the n-drift region 306 in the center of the racetrack-shaped gate 320. In other words, the common drain is enclosed by the gate 320.

The HV MOS transistor device 300 provided by the preferred embodiment includes a STI 304 for providing electrical isolation. It is noteworthy that the HV MOS transistor device 300 of the preferred embodiment further includes a plurality of isolation structures 330 such as a plurality of STI. A depth of the isolation structures 330 can be modified. For example, the depth of the isolation structures 330 can be equal to the depth of the STI 304 as mentioned in the first preferred embodiment and shown in FIG. 4. However, the isolation structures 330 can include the first isolation structure and the second isolation structure while a depth of the first isolation structure is equal to or larger than the depth of the STI 304 and a depth of the second isolation structure is smaller than the depth of the first isolation structure and of the STI 304 as mentioned in the second preferred embodiment and shown in FIG. 6. Furthermore, the first isolation structure can include a first portion and a second portion, which have depths different from each other, as shown in the second preferred embodiment and shown in FIG. 6. The modifications to the depth of the isolation structures 330 can be easily realized according to the first and second preferred embodiment and thus those details are omitted for simplicity. Additionally, when the isolation structure 330 includes the first isolation structure and the second isolation structure, which have depth deviation between each other, the second isolation structure having smaller depth than the STI and the first isolation structure is formed under the gate 320 at the common drain side.

Please still refer to FIG. 8. It is noteworthy that the isolation structures 330 are arranged along a direction parallel with extending direction of the gate 320 in the preferred embodiment. More important, the isolation structures 330 interrupt into the n-drift region 306. Consequently, it looks like there are n-drift regions 306 and isolation structures 330 alternately arranged under the gate 320 while the n-drift regions 306 are electrically connected to each other and thus to form a continuous region. According to the preferred embodiment, the width of the isolation structures 330 and a width of the n-drift regions 306 under the liner gate portions 320a are equal to each other, but not limited to this. However, the width of the isolation structures 330 and the width of the n-drift regions 306 under the curved end gate portions 320b are different from each other. More important, each of the isolation structures 330 under the curved end gate portions 320b can include various widths. As shown in FIG. 8, the isolation structures 330 under the curved end gate portions 320b respectively include a first end 332 and a second end 334. The first end 332 includes a width $W_1$ and the second end 334 includes a width $W_2$. And the width $W_1$ is smaller than the width $W_2$. To prevent the breakdown voltage from being lowered due to the local concentration of the electric field near the curved end gate portions 320b, the preferred embodiment provides the isolation structures 330 having larger width. Accordingly, the electric field crowding effect is mitigated.

As shown in FIG. 8, the n-drift regions 306 and the isolation structures 330 are alternately arranged under the gate 320. In the case that the isolation structure 330 is formed under the gate 320, the isolation structure 330 is overlapped by the entire the gate 320. In other words, the entire gate 320 is accommodated on the isolation structure 330. Consequently, the isolation structure 330 occupies where the channel region supposed to be formed. However, in the case that n-drift region 306 and the portion of the p-body region are formed under the gate 320, the channel region is still obtained when proper voltage is applied. Thus it is ensured that current achieves the source region from the drain region through the n-drift region 306 and the channel region. Consequently, the high voltage is step-downed and the acceptable lower voltage signal is obtained.

Therefore, according to the HV MOS transistor device 300 provided by the third preferred embodiment, electric field of the n-drift regions 306 is reduced by forming the isolation structures 330 and the n-drift regions 306 alternately arranged under the gate 320. Furthermore, when the isolation structures 330 includes a depth shallower than the conventional STI 304, the electric field crowding effect is consequently reduced. Accordingly, the breakdown voltage is increased without increasing $R_{ON}$.

As mentioned above, the HV MOS transistor device provides the isolation structures alternately arranged with the drift regions under the gate, thus the electric field of the drift regions is reduced. When the isolation structure itself includes different depths, the isolation structure shallower than original STI is further used to mitigate the electric field crowding effect. Consequently, the present invention successfully increases the breakdown voltage without increasing $R_{ON}$, and thus provides an improved HV MOS transistor device. Furthermore, the HV MOS transistor device provided by the present invention can be easily employed in the common source or common drain approach. And by providing the isolation structures having various widths in itself, the breakdown voltage is further prevented from being lowered. In other words, the HV MOS transistor device provided by the present invention successfully solves the breakdown voltage lowering issue which always occurs in the common source or common drain approach due to the electric field crowding effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A high voltage metal-oxide-semiconductor (HV MOS) transistor device comprising:
   a substrate;
   a gate formed on the substrate;
   a source region and a drain region formed in the substrate at respective sides of the gate;
   a first isolation structure formed under the gate, the entire gate being positioned on the first isolation structure and exposing a portion of the first isolation structure from a cross-sectional view; and a body region and a drift region, the source region being formed in the body region, and the body region and the drain region being formed in the drift region.

2. The HV MOS transistor device according to claim 1, further comprising a plurality of second isolation structures formed in the substrate, the second isolation structures electrically isolate the HV MOS transistor.

3. The HV MOS transistor device according to claim 2, wherein a depth of the first isolation structure is equal to a depth of the second isolation structures.

4. The HV MOS transistor device according to claim 2, wherein the first isolation structure further comprises a first portion and a second portion, the first portion comprises a first depth and the second portion comprises a second depth.

5. The HV MOS transistor device according to claim 4, wherein the first depth is equal to a depth of the second isolation structures and the second depth is larger than the depth of the second isolation structures.

6. The HV MOS transistor device according to claim 2, further comprising a third isolation structure positioned under the gate.

7. The HV MOS transistor device according to claim 6, wherein a depth of the third isolation structure is smaller than a depth of the first isolation structure and a depth of the second isolation structures.

8. The HV MOS transistor device according to claim 6, wherein the gate overlaps a portion of the third isolation structure.

9. The HV MOS transistor device according to claim 6, wherein the first isolation structure physically contacts the third isolation structure.

10. A HV MOS transistor device comprising:
a substrate;
a gate positioned on the substrate and extending along a first direction;
a plurality of drift regions formed in the substrate, the drift regions being arranged along the first direction;
a plurality of first isolation structures formed in the substrate, each of the first isolation structures extending along a second direction, and the second direction being perpendicular to the first direction; and
a second isolation structure formed in the substrate and extending along the first direction, and the gate overlapping a portion of the second isolation structure;
wherein the gate covers a portion of each drift region and a portion of each first isolation structure, and the drift regions and the first isolation structures under the gate are alternately arranged along the first direction.

11. The HV MOS transistor device according to claim 10, wherein the second isolation structure overlaps a portion of each first isolation structure.

12. The HV MOS transistor device according to claim 10, wherein a depth of the second isolation structure is smaller than a depth of the first isolation structure.

13. The HV MOS transistor device according to claim 10, wherein the drift regions are electrically connected to each other.

14. The HV MOS transistor device according to claim 13, further comprising a source region and a drain region formed in the drift region at respective sides of the gate.

15. The HV MOS transistor device according to claim 10, wherein each of the first isolation structures further comprises a first end and a second end.

16. The HV MOS transistor device according to claim 15, wherein a width of the first end is different from a width of the second end.

* * * * *